United States Patent
Kim et al.

(10) Patent No.: US 10,626,504 B2
(45) Date of Patent: Apr. 21, 2020

(54) PLATED STEEL SHEET FOR HOT PRESS FORMING HAVING EXCELLENT WELDABILITY AND CORROSION RESISTANCE, FORMING MEMBER, AND MANUFACTURING METHOD THEREOF

(71) Applicant: POSCO, Pohang-si, Gyeongsangbuk-do (KR)

(72) Inventors: Myung-Soo Kim, Gwangyang-si (KR); Hyeon-Seok Hwang, Gwangyang-si (KR); Young-Jin Kwak, Gwangyang-si (KR)

(73) Assignee: POSCO, Pohang-si, Gyeongsangbuk-do (KR)

( * ) Notice: Subject to any disclaimer, the term of this patent is extended or adjusted under 35 U.S.C. 154(b) by 0 days.

(21) Appl. No.: 16/235,716

(22) Filed: Dec. 28, 2018

(65) Prior Publication Data

US 2019/0136386 A1    May 9, 2019

Related U.S. Application Data

(62) Division of application No. 15/102,833, filed as application No. PCT/KR2014/012273 on Dec. 12, 2014, now Pat. No. 10,190,221.

(30) Foreign Application Priority Data

Dec. 20, 2013   (KR) .................. 10-2013-0160776

(51) Int. Cl.
*B21D 22/02*   (2006.01)
*C23C 28/02*   (2006.01)
(Continued)

(52) U.S. Cl.
CPC .......... *C23C 28/021* (2013.01); *B21D 22/022* (2013.01); *B32B 15/011* (2013.01);
(Continued)

(58) Field of Classification Search
None
See application file for complete search history.

(56) References Cited

U.S. PATENT DOCUMENTS 3,268,422 A    8/1966   Smith et al.
6,296,805 B1   10/2001  Laurent et al.
(Continued)

FOREIGN PATENT DOCUMENTS

CN    101316942 A    12/2008
JP    S62-001860 A   1/1987
(Continued)

OTHER PUBLICATIONS

International Search Report dated Mar. 20, 2015 issued in International Patent Application No. PCT/KR2014/012273 (English translation).

(Continued)

*Primary Examiner* — Daniel J. Schleis
(74) *Attorney, Agent, or Firm* — Morgan, Lewis & Bockius LLP

(57) ABSTRACT

The present invention relates to a plated steel sheet for hot press forming, a hot-press forming member manufactured using the same, and a manufacturing method thereof. The plated steel sheet comprises: a base steel sheet and a composite plated layer that is formed on at least one surface of the base steel sheet, and has a Mn-based plated layer and an Al-based plated layer alternately formed therein, an Al-based plated layer being formed on the uppermost layer thereof, wherein the composite plated layer has a total thickness of 5 to 30 μm, and in this case, the Mn-based plated layer accounts for 5 to 60% of the total thickness.

15 Claims, 3 Drawing Sheets

(51) Int. Cl.
| | |
|---|---|
| *C23C 2/12* | (2006.01) |
| *C23C 14/14* | (2006.01) |
| *C23C 2/28* | (2006.01) |
| *C23C 28/00* | (2006.01) |
| *B32B 15/01* | (2006.01) |
| *C22C 38/00* | (2006.01) |
| *C22C 38/02* | (2006.01) |
| *C22C 38/04* | (2006.01) |
| *C22C 38/22* | (2006.01) |
| *C22C 38/24* | (2006.01) |
| *C22C 38/26* | (2006.01) |
| *C22C 38/28* | (2006.01) |
| *C22C 38/32* | (2006.01) |
| *C22C 38/38* | (2006.01) |
| *C22C 38/60* | (2006.01) |
| *C23C 24/02* | (2006.01) |

(52) U.S. Cl.
CPC .......... *B32B 15/012* (2013.01); *C22C 38/001* (2013.01); *C22C 38/02* (2013.01); *C22C 38/04* (2013.01); *C22C 38/22* (2013.01); *C22C 38/24* (2013.01); *C22C 38/26* (2013.01); *C22C 38/28* (2013.01); *C22C 38/32* (2013.01); *C22C 38/38* (2013.01); *C22C 38/60* (2013.01); *C23C 2/12* (2013.01); *C23C 2/28* (2013.01); *C23C 14/14* (2013.01); *C23C 24/02* (2013.01); *C23C 28/42* (2013.01)

(56) References Cited

U.S. PATENT DOCUMENTS

| | | | |
|---|---|---|---|
| 9,945,013 B2 * | 4/2018 | Nonaka | ................... C23C 2/02 |
| 2008/0075970 A1 | 3/2008 | Suzuki et al. | |
| 2008/0286603 A1 | 11/2008 | Oh et al. | |
| 2015/0027596 A1 | 1/2015 | Miyoshi et al. | |
| 2015/0044499 A1 | 2/2015 | Maki et al. | |

FOREIGN PATENT DOCUMENTS

| | | | |
|---|---|---|---|
| JP | H02-263962 A | | 10/1990 |
| JP | 05-001388 A | | 1/1993 |
| JP | H05202488 | * | 8/1993 |
| JP | 6-49683 A | | 2/1994 |
| JP | 07-252623 A | | 10/1995 |
| JP | H07-0292436 A | | 11/1995 |
| JP | 2000-129467 A | | 5/2000 |
| JP | 2006-022395 A | | 1/2006 |
| JP | 2006-299377 A | | 11/2006 |
| JP | 5-202488 B2 | | 6/2013 |
| JP | 2013-221202 A | | 10/2013 |
| KR | 10-1996-0009192 B1 | | 12/1993 |
| KR | 10-1996-0009193 B1 | | 12/1993 |
| KR | 10-1996-0009194 B1 | | 12/1993 |
| KR | 10-2015-0049504 A | | 5/2015 |
| WO | 2013/132816 A1 | | 9/2013 |

OTHER PUBLICATIONS

European Office Action dated Jan. 3, 2017 issued in European Patent Application No. 14872120.2.
European Search Report dated May 9, 2017 issued in European Patent Application No. 14872120.2.
Japanese Office Action dated May 9, 2017 issued in Japanese Patent Application No. 2016-541040 (with English translation).
Chinese Office Action dated Nov. 3, 2017 issued in Chinese Patent Application No. 201480069513 (with English translation).
Second Office Action dated Jun. 26, 2018 issued in Chinese Patent Application No. 201480069513.6 (with English translation).
U.S. Notice of Allowance dated Sep. 11, 2018 issued in U.S. Appl. No. 15/102,833.
U.S. Final Office Action dated May 16, 2018 issued in U.S. Appl. No. 15/102,833.
U.S. Non-Final Office Action dated Jan. 22, 2018 issued in U.S. Appl. No. 15/102,833.

* cited by examiner

PLATED STEEL SHEET FOR HOT PRESS FORMING HAVING EXCELLENT WELDABILITY AND CORROSION RESISTANCE, FORMING MEMBER, AND MANUFACTURING METHOD THEREOF

RELATED APPLICATIONS

This application is a divisional patent application of U.S. patent application Ser. No. 15/102,833, filed on Jun. 8, 2016, which is the U.S. National Phase under 35 U.S.C. § 371 of International Application No. PCT/KR2014/012273, filed on Dec. 12, 2014, which in turn claims the benefit of Korean Patent Application No. 10-2013-0160776 filed on Dec. 20, 2013, the disclosure of which applications are incorporated by reference herein.

TECHNICAL FIELD

The present disclosure relates to a plated steel sheet for hot press forming (HPF) and a formed member, and more particularly, to a plated steel sheet having high weldability and corrosion resistance for manufacturing automotive components by HPF, a member formed using the plated steel sheet, and methods of manufacturing the plated steel sheet and the formed member.

BACKGROUND ART

Recently, the application of high-strength steels to automobiles has increased for the purpose of weight reduction. However, high-strength steels are easily fractured when processed at room temperature. In addition, since high-strength steels undergo spring back during forming processes, it is difficult to precisely determine the dimension high-strength steels so as to manufacture complicated parts. Due to these reasons, hot press forming (HPF) has become favored as a method for shaping high-strength steels.

HPF is a method of forming steel sheets into complicated shapes at high temperatures at which steel sheets become soft and ductile. In detail, HPF is performed by heating a steel sheet to an austenite temperature range or higher, pressing the steel sheet, and rapidly cooling the steel sheet simultaneously with the pressing so as to cause the steel sheet to undergo transformation into martensite. In this manner, precise high-strength products may be manufactured by HPF.

However, if steel is heated to a high temperature, surface corrosion or decarbonization may occur. Thus, steel plated with a Zn-based or Al-based material is widely used in an HPF process. In particular, galvanized steel sheets having Zn-based plating layers are highly resistant to corrosion because zinc (Zn) provides sacrificial corrosion protection to the steel sheets.

A hot-dip galvanized steel sheet disclosed in Japanese Patent Application Laid-open Publication No. 2006-022395 is an example of such steel sheets resistant to corrosion. If a steel sheet is subjected to a hot-dip galvanizing process and then an HPF process, an alloy having a zinc content of 70% or greater is formed on the steel sheet, and thus the corrosion resistance of the steel sheet is improved.

However, if a galvanized steel sheet such as a hot-dip galvanized steel sheet is heated in high-temperature air, zinc oxides are formed on the galvanized steel sheet, and after a forming process, such zinc oxides function as a resistor hindering the flow of current during a welding process such as a spot welding process, thereby worsening the weldability of the galvanized steel sheet. Due to this reason, additional processes may be performed after a forming process so as to remove zinc oxides from such a galvanized steel sheet and thus to improve the weldability of the galvanized steel sheet during a spot welding process. However, this increases manufacturing costs.

A method of preventing the formation of oxides on a steel sheet after an HPF process is disclosed in U.S. Pat. No. 6,296,805. According to the disclosed method, a steel sheet is plated with aluminum (Al) so as to be used as a steel sheet for HPF. If a steel sheet is plated with aluminum (Al) having a high degree of heat resistance and is then subjected to an HPF process, a product formed by the HPF process does not have surface oxides or has very low amounts of surface oxides, and thus the spot weldability of the product is very high. However, unlike zinc (Zn), aluminum provides very insufficient sacrificial corrosion protection to a base steel sheet, and thus if the iron surface of the base steel sheet is exposed, the base steel sheet may markedly corrode.

DISCLOSURE

Technical Problem

To solve above-mentioned problems, an aspect of the present disclosure may provide a plated steel sheet for hot press forming (HPF). The plated steel sheet has a high degree of spot weldability because the thickness of surface oxides of the plated steel sheet is small even after an HPF process. In addition, the plated steel sheet is resistant to corrosion because an alloy layer formed on an iron surface of the plated steel sheet is electrochemically less noble than iron (Fe) of the plated steel sheet, and thus provides sacrificial corrosion protection to iron (Fe) of the plated steel sheet. Aspects of the present disclosure may also provide a hot-press formed member manufactured using the plated steel sheet and methods of manufacturing the plated steel sheet and the hot-press formed member.

Aspects of the present disclosure are not limited to the above-mentioned aspects. The above-mentioned aspects and other aspects of the present disclosure will be clearly understood by those skilled in the art through the following description.

Technical Solution

According to an aspect of the present disclosure, a plated steel sheet may include: a base steel sheet; and a composite plating layer formed on at least one side of the base steel sheet, the composite plating layer including a Mn-based plating layer and an Al-based plating layer alternately formed with the Al-based plating layer being an uppermost layer, wherein the composite plating layer may have a total thickness of 5 μm to 30 μm, and the Mn-based plating layer may have a thickness accounting for 5% to 60% of the total thickness of the composite plating layer.

The composite plating layer may have a total thickness of 5 μm to 25 μm, and the Mn-based plating layer may have a thickness accounting for 20% to 50% of the total thickness of the composite plating layer.

The Mn-based plating layer may include at least one selected from the group consisting of chromium (Cr), zinc (Zn), beryllium (Be), magnesium (Mg), calcium (Ca), and titanium (Ti) in an amount of 20 wt % or less (excluding 0 wt %).

The Al-based plating layer may include at least one selected from the group consisting of zinc (Zn), silicon (Si), magnesium (Mg), and manganese (Mn) in an amount of 20 wt % or less (excluding 0 wt %).

The plated steel sheet may be for hot press forming (HPF).

According to another aspect of the present disclosure, a hot-press formed member formed by performing an HPF process on the plated steel sheet may include: a base steel sheet; and an alloy layer formed on at least one side of the base steel sheet.

The alloy layer may include a plurality of alloys. For example, the alloy layer may include at least two alloys selected from the group consisting of an Fe—Mn-based alloy, an Fe—Al—Mn-based alloy, an Fe—Al-based alloy, and an Al—Mn-based alloy.

The alloy layer may further include at least one alloy selected from the group consisting of a Zn—Mn-based alloy, a Zn—Fe-based alloy, an Fe—Mn—Al—Mg-based alloy, and an Fe—Mn—Al—Si-based alloy.

The alloy layer may include an uppermost layer formed of an Al-containing alloy.

For example, the alloy layer may include an uppermost layer formed of an Fe—Al—Mn-based alloy, an Fe—Al-based alloy, or an Al—Mn-based alloy.

For example, the alloy layer may include an uppermost layer formed of an Fe—Al—Mn-based alloy, an Fe—Al-based alloy, or an Al—Mn-based alloy, an Fe—Mn—Al—Mg-based alloy, or an Fe—Mn—Al—Si-based alloy.

Surface oxides formed on an outermost surface of the alloy layer may have a thickness of 2 μm or less.

According to another aspect of the present disclosure, a method of manufacturing a plated steel sheet may include: preparing a base steel sheet; and forming a composite plating layer on at least one side of the base steel sheet by alternately forming a Mn-based plating layer and an Al-based plating layer with the Al-based plating layer being an uppermost layer, wherein the composite plating layer may have a total thickness of 5 μm to 30 μm, and the Mn-based plating layer may have a thickness accounting for 5% to 60% of the total thickness of the composite plating layer.

The Mn-based plating layer may be formed by a dry plating method.

According to another aspect of the present disclosure, a method of manufacturing a hot-press formed member may include: heating a plated steel sheet to a temperature range of an $Ac_3$ transformation point to 1000° C. at an average heating rate of 3° C./s to 200° C./s; hot forming the heated plated steel sheet within the temperature range; and cooling the hot-formed plated steel sheet.

After the heating of the plated steel sheet, the method may further include maintaining the heated plated steel sheet within the temperature range for 240 seconds.

The above-described aspects of the present disclosure do not include all aspects or features of the present disclosure. Other aspects or features, and effects of the present disclosure will be clearly understood from the following descriptions of exemplary embodiments.

Advantageous Effects

According to the present disclosure, since the uppermost layer of the composite plating layer of the plated steel sheet is an Al-based plating layer, the hot-press formed member manufactured by performing a hot press forming (HPF) process on the plated steel sheet has a thin surface oxide layer, and thus a high degree of spot weldability.

In addition, according to the present disclosure, the hot-press formed member formed by performing an HPF process on the plated steel sheet has alloys such as an Fe—Mn-based alloy, an Fe—Al—Mn-based alloy, an Fe—Al-based alloy, or an Al—Mn-based alloy because alloying occurs between the composite plating layer and iron (Fe) of the plated steel sheet during heating, and since the alloys are less noble than iron (Fe) of the plated steel sheet, the alloys provide sacrificial corrosion protection to iron (Fe) of the plated steel sheet. Therefore, the hot-press formed member has a high degree of corrosion resistance.

BEST MODE FOR INVENTION

Figure 1A:
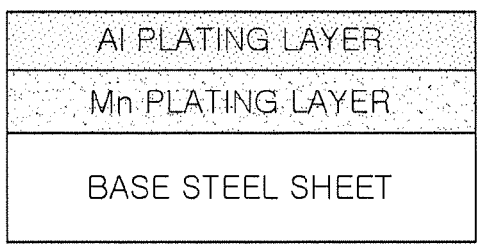
FIGS. 1A to 1C are schematic cross-sectional views illustrating exemplary plated steel sheets for hot press forming (HPF) including composite plating layers according to an exemplary embodiment of the present disclosure.

Exemplary embodiments of the present disclosure will now be described in detail with reference to the accompanying drawings. The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity.

1. Plated Steel Sheet

Since aluminum plated steel sheets have heat resistance, very thin oxides layers are formed on aluminum plated steel sheets after a heating and forming process is performed on the aluminum plated steel sheets. Thus, products formed of aluminum plated steel sheets have a high degree of spot weldability. However, after a forming process is performed on aluminum plated steel sheets, alloy layers formed on iron surfaces of the steel sheets have a base electrochemical potential insufficient for protecting the steel sheets, and thus do not provide sacrificial corrosion protection to the steel sheets. Therefore, it is required to plate a steel sheet for hot press forming (HPF) with a heat-resistant plating layer in which an alloy having a sufficient base electrochemical potential for protecting iron (Fe) of the steel sheet is formed after a heating and forming process.

The inventors have conducted much research to achieve the above-mentioned objects and found that if a composite plating layer having a total thickness of 5 μm to 30 μm is formed on a base steel sheet by alternately forming a Mn-based plating layer and an Al-based plating layer in such a manner that the uppermost layer of the composite plating layer is the Al-based plating layer and the Mn-based plating layer accounts for 60% or less of the total thickness of the composite layer, alloying occurs between the composite plating layer and iron (Fe) of the base steel sheet in a later heating process, and thus alloys such as an Fe—Mn-based alloy, an Fe—Al—Mn-based alloy, an Fe—Al-based alloy, or an Al—Mn-based alloy are formed. Then, when a press forming process is performed on the steel sheet plated with the composite plating layer, very small amounts of surface oxides are formed on the plated steel sheet, and thus the plated steel sheet has a high degree of spot weldability and a high degree of corrosion resistance. Based on this knowledge, the inventors have invented the present invention.

In more detail, according to an exemplary embodiment of the present disclosure, a plated steel sheet for HPF includes: a base steel sheet; and a composite plating layer formed on at least one side of the base steel sheet by alternately forming a Mn-based plating layer and an Al-based plating layer with the uppermost layer being the Al-based plating layer, wherein the composite plating layer has a total thickness of 5 μm to 30 μm, and the Mn-based plating layer accounts for 5% to 60% of the total thickness of the composite plating layer.

The base steel sheet may be a general carbon steel sheet. For example, the base steel sheet may include: carbon (C): 0.1 wt % to 0.4 wt %, silicon (Si): 0.05 wt % to 1.5 wt %, manganese (Mn): 0.5 wt % to 3.0 wt %, and a balance of iron (Fe) and inevitable impurities. However, the base steel sheet is not limited thereto.

Carbon (C): 0.1 wt % to 0.4 wt %

Carbon (C) is a very effective element in increasing the strength of the base steel sheet. However, if the content of carbon (C) in the base steel sheet is too high, the weldability and low-temperature toughness of the steel sheet are decreased. If the content of carbon (C) in the base steel sheet is less than 0.1 wt %, even though an HPF process is performed in an austenite single phase, it may be difficult to obtain an intended degree of strength. Conversely, if the content of carbon (C) in the base steel sheet is greater than 0.4 wt %, the weldability and low-temperature toughness of the base steel sheet may deteriorate, and the strength of the base steel sheet may excessively increase to cause disadvantages in manufacturing processes such as difficulty in transferring the base steel sheet during an annealing process and a plating process. Therefore, it may be preferable that the content of carbon (C) be within a range of 0.1 wt % to 0.4 wt %.

Silicon (Si): 0.05 wt % to 1.5 wt %

Silicon (Si) is an element added to remove oxygen and improve strength by solid-solution strengthening. In the exemplary embodiment, to obtain these effects, it may be preferable that the content of silicon (Si) be within a range of 0.05 wt % or greater. However, if the content of silicon (Si) is greater than 1.5 wt %, it may be difficult to perform a pickling process on a hot-rolled steel sheet, and thus surface defects such as scales may remain due to poor pickling or oxides not removed through a pickling process.

Manganese (Mn): 0.5 wt % to 3.0 wt %

Manganese (Mn) is an effective element in increasing strength by solid-solution strengthening and retarding transformation from austenite to ferrite. In the exemplary embodiment, to obtain these effects, it may be preferable that the content of manganese (Mn) be within a range of 0.5 wt % or greater. However, if the content of manganese (Mn) in the base steel sheet is greater than 3.0 wt %, properties of the base steel sheet such as weldability and hot-rolling properties may deteriorate.

In the exemplary embodiment of the present disclosure, the other component of the base steel sheet is iron (Fe). However, impurities of raw materials or manufacturing environments may be inevitably included in the base steel sheet, and such impurities may not be removed from the base steel sheet. Such impurities are well-known to those of ordinary skill in manufacturing industries, and thus descriptions thereof will not be given in the present disclosure.

If the base steel sheet of the exemplary embodiment includes the above-mentioned alloying elements within the above-mentioned content ranges, intended effects may be sufficiently obtained. However, the base steel sheet of the exemplary embodiment may further include at least one selected from the group consisting of nitrogen (N): 0.001 wt % 0.02 wt %, boron (B): 0.0001 wt % to 0.01 wt %, titanium (Ti): 0.001 wt % to 0.1 wt %, niobium (Nb): 0.001 wt % to 0.1 wt %, vanadium (V): 0.001 wt % to 0.01 wt %, chromium (Cr): 0.001 wt % to 1.0 wt %, molybdenum (Mo): 0.001 wt % to 1.0 wt %, antimony (Sb): 0.001 wt % to 0.1 wt %, and tungsten (W): 0.001 wt % to 0.3 wt %. In this case, properties of the base steel sheet such as strength, toughness, or weldability may be further improved.

Nitrogen (N): 0.001 wt % to 0.02 wt %

Nitrogen (N) combines with aluminum (Al) in austenite grains during solidification, thereby leading to the precipitation of fine nitrides and facilitating twining. In this manner, nitrogen (N) improves the strength and ductility of the base steel sheet during a forming process. However, if the content of nitrogen (N) in the base steel sheet increases, the precipitation of nitrides may excessively occur, and thus the hot-rolling properties and elongation of the base steel sheet may deteriorate or decrease. Thus, it may be required to adjust the content of nitrogen (N). If the content of nitrogen (N) is less than 0.001 wt %, excessively high manufacturing costs may be incurred so as to adjust the content of nitrogen (N) during a steel making process. Conversely, if the content of nitrogen (N) is greater than 0.02 wt %, the precipitation of nitrides may excessively occur, thereby worsening the hot-rolling properties and elongation of the base steel sheet and causing the formation of cracks.

Boron (B): 0.0001 wt % to 0.01 wt %

Boron (B) retards transformation from austenite to ferrite. In the exemplary embodiment, to obtain this effect, it may be preferable that the content of boron (B) be within a range of 0.0001 wt % or greater. However, if the content of boron (B) is greater than 0.01 wt %, the hot-rolling properties of the base steel sheet may deteriorate.

Each of Titanium (Ti), Niobium (Nb), and Vanadium (V): 0.001 wt % to 0.1 wt %

Titanium (Ti), niobium (Nb), and vanadium (V) are effective elements in increasing the strength of the base steel sheet, reducing the grain size of the base steel sheet, and improving the heat treatability of the base steel sheet. In the exemplary embodiment, to obtain these effects, it may be preferable that the content of each of titanium (Ti), niobium (Nb), and vanadium (V) be within a range of 0.001 wt % or greater. However, if the content of each of titanium (Ti), niobium (Nb), and vanadium (V) is greater than 0.1 wt %, manufacturing costs increase, and it is difficult to obtain intended degrees of strength and yield strength because of excessive formation of carbides and nitrides.

Each of Chromium (Cr) and Molybdenum (Mo): 0.001 wt % to 1.0 wt %

Chromium (Cr) and molybdenum (Mo) are effective in increasing the hardenability and toughness of the base steel sheet. Thus, chromium (Cr) and molybdenum (Mo) may be usefully added to the base steel sheet so that the base steel sheet may absorb a large amount of impact energy. However, if the content of each of chromium (Cr) and molybdenum (Mo) is less than 0.001 wt %, the above-described effects may not be sufficiently obtained, and if the content of each of chromium (Cr) and molybdenum (Mo) is greater than 1.0%, the above-described effects do not further increase and manufacturing costs increase.

Antimony (Sb): 0.001 wt % to 0.1 wt %

Antimony (Sb) leads to the formation of uniform scales by preventing selective oxidation of grain boundaries during a hot rolling process, and improves pickling properties of hot-rolled steel sheets. In the exemplary embodiment, to obtain these effects, it may be preferable that the content of antimony (Sb) be within a range of 0.001 wt % or greater. If the content of antimony (Sb) is greater than 0.1 wt %, the above-described effects do not further increase, and manufacturing costs increase and embrittlement occurs during a hot rolling process.

Tungsten (W): 0.001 wt % to 0.3 wt %

Tungsten (W) is an element improving the hardenability of the base steel sheet. In addition, tungsten-containing precipitates have an effect of guaranteeing strength. In the exemplary embodiment, to obtain these effects, it may be preferable that the content of tungsten (W) be within a range of 0.001 wt % or greater. If the content of tungsten (W) is greater than 0.3 wt %, the above-described effects do not further increase, and manufacturing costs increase.

Next, according to an exemplary embodiment of the present disclosure, the composite plating layer is formed by alternately forming a Mn-based plating layer and an Al-based plating layer with the uppermost layer being the Al-based plating layer. The composite plating layer has a total thickness of 5 μm to 30 μm, and the thickness of the Mn-based plating layer is preferably 5% to 60% of the total thickness of the composite plating layer.

Manganese (Mn) is electrochemically less noble than iron (Fe). If manganese (Mn) combines with aluminum (Al) or iron (Fe), alloys such as an Fe—Mn-based alloy, an Fe—Al—Mn-based alloy, or an Al—Mn-based alloy are formed, and the alloys are electrochemically less noble than aluminum (Al) or an Al—Fe-based alloy. Therefore, if the content of manganese (Mn) in the composite plating layer increases, after a heating and forming process, the potential of an alloy layer becomes less noble, and thus the corrosion of iron (Fe) of the base steel sheet may be more effectively prevented by sacrificial corrosion protection. However, if the thickness of the Mn-based plating layer accounts for a large portion of the total thickness of the composite plating layer, even though sacrificial corrosion protection is reliably provided to iron (Fe) of the base steel sheet, manganese (Mn) may diffuse to a surface layer, and some of the diffused manganese (Mn) may form manganese oxides. In this case, spot weldability may decrease because such surface manganese oxides have electric resistance higher than those of metals. In addition, if the thickness of the Mn-based plating layer accounts for a too small portion of the total thickness of the composite plating layer, alloys such as an Fe—Mn-based alloy, an Fe—Al—Mn-based alloy, or an Al—Mn-based alloy may not be formed or may be formed in too small amounts by alloying between manganese (Mn) and aluminum (Al) or iron (Fe). In this case, sacrificial corrosion protection may be hardly provided by an alloy layer, and thus the corrosion resistance of the plated steel sheet may be insufficient. Therefore, according to the exemplary embodiment, preferably, the thickness of the Mn-based plating layer may be 5% to 60% of the total thickness of the composite plating layer, for example, about 10% to about 55%, or about 20% to about 50% of the total thickness of the composite plating layer.

If the composite plating layer is too thin, sufficient corrosion resistance is not guaranteed, and if the composite plating layer is too thick, manufacturing costs increase even though corrosion resistance is sufficient. Therefore, it may be preferable that the thickness of the composite plating layer be within the range of 5 μm to 30 μm, for example, about 5 μm to about 25 μm. Herein, the thickness of the composite plating layer refers to a value measured on one side of the plated steel sheet.

The composite plating layer may include two plating layers: one Mn-based plating layer and one Al-based plating layer, or may include at least three plating layers. In any case, the uppermost layer of the composite plating layer may be an Al-based plating layer.

Figure 1B:
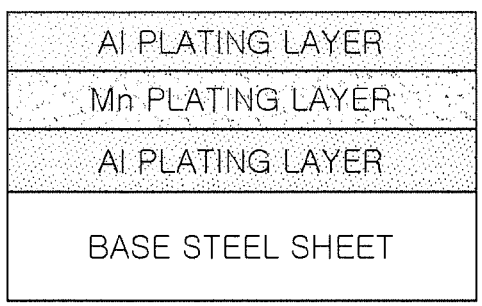
Figure 1C:
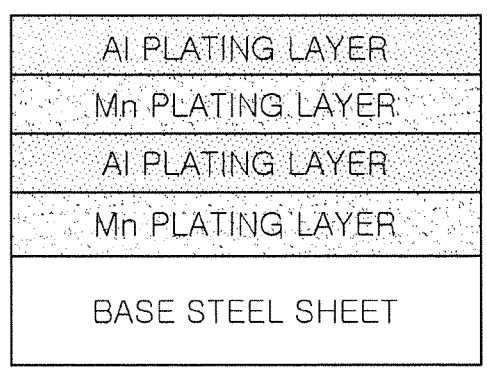

For example, the composite plating layer may include two layers in the order of a Mn-based plating layer and an Al-based plating layer as illustrated in FIG. 1A; three layers in the order of an Al-based plating layer, a Mn-based plating layer, and an Al-based plating layer as illustrated in FIG. 1B; or four layers in the order of a Mn-based plating layer, an Al-based plating layer, a Mn-based plating layer, and an Al-based plating layer as illustrated in FIG. 1C.

If the uppermost layer of the composite plating layer is a Mn-based plating layer, oxides containing manganese (Mn) as the main component may be formed in a surface layer of the plated steel sheet after an HPF process, and thus the spot weldability of the plated steel sheet may be worsened.

In addition, preferably, the Mn-based plating layer may include: manganese (Mn) in an amount of 80 wt % or greater; and at least one selected from the group consisting of chromium (Cr), zinc (Zn), beryllium (Be), magnesium (Mg), calcium (Ca), and titanium (Ti) in an amount of 20 wt % or less (excluding 0 wt %), which are electrochemically less noble than iron (Fe). Even in this case, a high degree of weldability and a high degree of corrosion resistance may be guaranteed after an HPF process as intended in the exemplary embodiment of the present disclosure.

In addition, preferably, the Al-based plating layer may include: aluminum (Al) in an amount of 80 wt % or greater; and at least one selected from the group consisting of zinc (Zn), silicon (Si), magnesium (Mg), and manganese (Mn) in an amount of 20 wt % or less (excluding 0 wt %) so as to control the hardness and plating bath toxicity of the Al-based plating layer. Even in this case, a high degree of weldability and a high degree of corrosion resistance may be guaranteed after an HPF process as intended in the exemplary embodiment of the present disclosure.

In an HPF process, when the plated steel sheet is heated to a temperature range of an $Ac_3$ transformation point to 1000° C. so as to hot-press the plated steel sheet, alloying may occur between the composite plating layer and iron (Fe) of the plated steel sheet, and thus at least two alloys selected from the group consisting of an Fe—Mn-based alloy, an Fe—Al—Mn-based alloy, an Fe—Al-based alloy, and an Al—Mn-based alloy may be formed. In this case, very small amounts of surface oxides may be formed after the HPF process, and thus the plated steel sheet may have a high degree of spot weldability and a high degree of corrosion resistance.

In an HPF process, when the plated steel sheet is heated to a temperature range of an $Ac_3$ transformation point to 1000° C. so as to hot-press the plated steel sheet, additional elements may undergo alloying, and thus at least one alloy selected from the group consisting of a Zn—Mn-based alloy, a Zn—Fe-based alloy, an Fe—Mn—Al—Mg-based alloy, and an Fe—Mn—Al—Si-based alloy may be additionally formed. The at least one additional alloy is not limited to the listed alloys. That is, the at least one additional alloy may be varied according to elements additionally added to the composite plating layer. Even in this case, very small amounts of surface oxides may be formed after the HPF process, and thus the plated steel sheet may have a high degree of spot weldability and a high degree of corrosion resistance.

2. Method of Manufacturing Plated Steel Sheet

Hereinafter, a method of manufacturing a plated steel sheet will be described according to an exemplary embodiment of the present disclosure.

According to the exemplary embodiment, the method of manufacturing a plated steel sheet includes: preparing a base steel sheet; and forming a composite plating layer on at least one side of the base steel sheet by alternately forming a Mn-based plating layer and an Al-based plating layer with the uppermost plating layer being the Al-based plating layer, wherein the composite plating layer has a total thickness of 5 μm to 30 μm, and the thickness of the Mn-based plating layer accounts for 5% to 60% of the total thickness of the composite plating layer.

First, the base steel sheet may be prepared by any manufacturing method as long as the base steel sheet includes the above-described elements. For example, the base steel sheet may be prepared by a manufacturing method known in the related art. For example, a commercially available steel sheet including the above-described elements may be prepared as the base steel sheet.

Next, the composite plating layer is formed on at least one side of the base steel sheet by alternately forming a Mn-based plating layer and an Al-based plating layer with the uppermost layer being the Al-based plating layer. At this time, preferably, the composite plating layer may have a total thickness of 5 μm to 30 μm, and the thickness of the Mn-based plating layer may be 5% to 60% of the total thickness of the composite plating layer.

The composite plating layer may be formed by a plating method known in the related art. For example, the Mn-based plating layer may be formed by a deposition method, and the Al-based plating layer may be formed by a hot dipping method or a deposition method. In the exemplary embodiment of the present disclosure, a dry plating method may be used for the efficiency of a plating process, and ease in performing the plating process and adjusting the amount of plating.

3. Hot-Press Formed Member

Hereinafter, a hot-press formed member manufactured using the plated steel sheet will be described according to an exemplary embodiment of the present disclosure.

The hot-press formed member of the exemplary embodiment may be obtained by performing an HPF process on the above-described plated steel sheet, and the hot-press formed member may include a base steel sheet and an alloy layer formed on at least one side of the base steel sheet. A general steel sheet having the above-described elements may be used as the base steel sheet.

As described above, the alloy layer is formed by alloying between iron (Fe) and the composite plating layer of the plated steel sheet, and the alloy layer includes a plurality of alloys. In detail, the alloy layer may include at least two alloys selected from the group consisting of an Fe—Mn-based alloy, an Fe—Al—Mn-based alloy, an Fe—Al-based alloy, and an Al—Mn-based alloy.

Figure 2A:
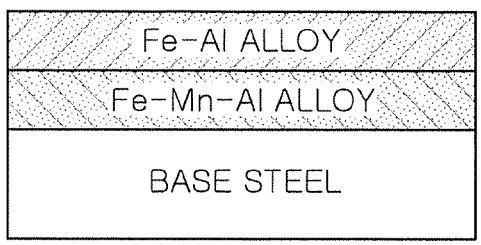
FIGS. 2A to 2D are schematic cross-sectional views illustrating exemplary hot-press formed members including alloy layers according to an exemplary embodiment of the present disclosure.
Figure 2B:
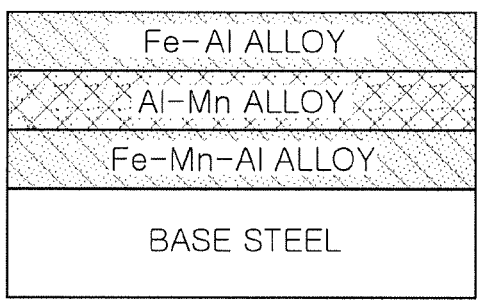
Figure 2C:
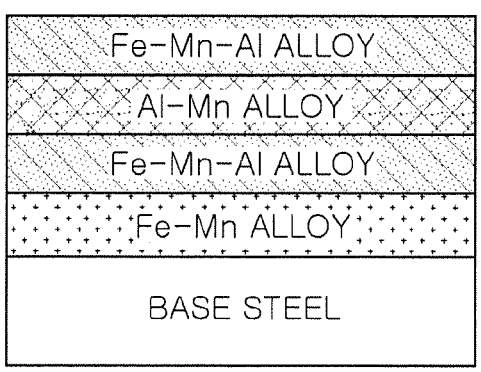
Figure 2D:
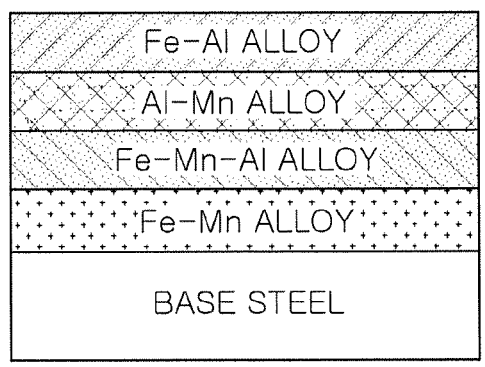

For example, the alloy layer may include: an Fe—Al-based alloy and an Fe—Al—Mn-based alloy as illustrated in FIG. 2A; an Fe—Al-based alloy, an Al—Mn-based alloy, and an Fe—Al—Mn-based alloy as illustrated in FIG. 2B; an Fe—Al—Mn-based alloy, an Al—Mn-based alloy, an Fe—Al—Mn-based alloy, and an Fe—Mn-based alloy as illustrated in FIG. 2C; or an Fe—Al-based alloy, an Al—Mn-based alloy, an Fe—Al—Mn-based alloy, and an Fe—Mn-based alloy as illustrated in FIG. 2D. However, the alloy layer of the exemplary embodiment is not limited to the examples. That is, the alloy layer of the exemplary embodiment is not limited to the above-described combinations of alloys. In addition, the alloy layer of the exemplary embodiment is not limited to the above-described order of alloys.

As described above, when alloying occurs between the composite plating layer and iron (Fe) of the plated steel sheet, additional elements may also undergo alloying, and thus at least one alloy selected from the group consisting of a Zn—Mn-based alloy, a Zn—Fe-based alloy, an Fe—Mn—Al—Mg-based alloy, and an Fe—Mn—Al—Si-based alloy may be additionally formed. The at least one additional alloy is not limited to the listed alloys. That is, the at least one additional alloy may be varied according to elements additionally added to the composite plating layer of the plated steel sheet.

Figure 3:
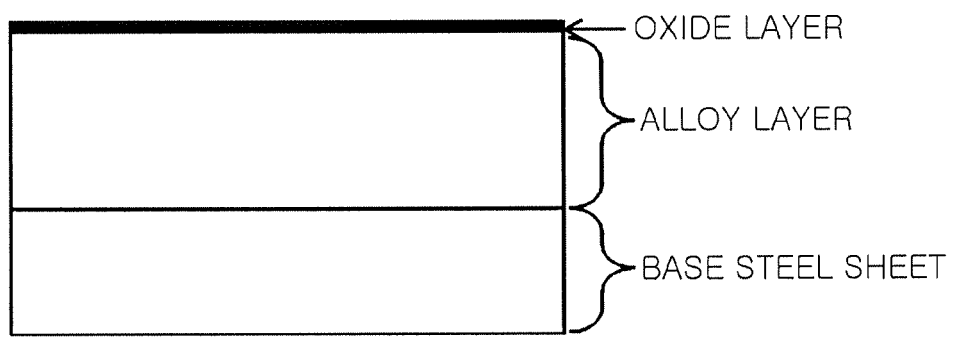
FIG. 3 is a schematic cross-sectional view illustrating a hot-press formed member including an oxide layer according to an exemplary embodiment of the present disclosure.

As illustrated in FIG. 3, oxides may be formed on the outermost surface of the alloy layer of the hot-press formed member of the exemplary embodiment. In this case, the oxides may be formed on the outermost surface of the alloy layer to a thickness of 2 μm or less, preferably 1 μm or less. If the surface oxides are formed to a small thickness as described above, the hot-press formed member may have a high degree of spot weldability.

In addition, the uppermost layer of the alloy layer may be formed of an alloy including aluminum (Al). That is, according to the exemplary embodiment, the alloy layer may include at least two alloys, and an alloy including aluminum (Al) may exist in the uppermost layer of the alloy layer, thereby leading to the formation of a thin surface oxide layer.

The alloy including aluminum (Al) may be an Fe—Al—Mn-based alloy, an Fe—Al-based alloy, or an Al—Mn-based alloy. Alternatively, owing to additional elements, the alloy including aluminum (Al) may be an Fe—Al—Mn-based alloy, an Fe—Al-based alloy, an Al—Mn-based alloy, an Fe—Mn—Al—Mg-based alloy, or an Fe—Mn—Al—Si-based alloy. However, the alloy including aluminum (Al) is not limited thereto. That is, the alloy including aluminum (Al) may be varied according to elements included in the composite plating layer of the plated steel sheet.

4. Method of Manufacturing Hot-Press Formed Member

Hereinafter, a method of manufacturing a hot-press formed member will be described according to an embodiment of the present disclosure.

According to the exemplary embodiment, the method of manufacturing a hot-press formed member includes: heating the above-described plated steel sheet to a temperature range of an Ac3 transformation point to 1000° C. at an average heating rate of 3° C./s to 200° C./s; hot forming the heated plated steel sheet within the temperature range; and cooling the hot-formed plated steel sheet.

The heating process may be performed by any method usually used in the related art such as an electric furnace method, a gas furnace method, a flame heating method, an electric heating method, a high frequency heating method, or an induction heating method. However, the heating process is not limited thereto.

In the heating process, the plated steel sheet may be heated to a temperature range of about the $Ac_3$ transformation point (ferrite-to-austenite transformation temperature) to about 1000° C., preferably, to a temperature range of about the $Ac_3$ transformation point (ferrite-to-austenite transformation temperature) to about 950° C. When the plated steel sheet is heated to the above-mentioned heating temperature range, alloying occurs between iron (Fe) and the composite plating layer of the plated steel sheet, and thus alloys such as an Fe—Mn-based alloy, an Fe—Al—Mn-based alloy, an Fe—Al-based alloy, or an Al—Mn-based alloy are formed.

Furthermore, the heating process may be performed at an average heating rate of about 3° C./s to about 200° C./s, and more preferably about 5° C./s to about 150° C./s. If the heating rate is within the above-mentioned range, high corrosion resistance, high productivity, and the formation of a thin surface oxide layer may be guaranteed. For example, if the heating rate is lower than the above-mentioned range, it will take much time to reach an intended temperature, and thus surface oxides may be formed to a thickness of 1 μm or greater due to a long heating time. In addition, the diffusion of iron (Fe) of the plated steel sheet into the composite plating layer may increase, and thus the content of iron (Fe) in an alloy layer may increase, thereby lowering corrosion resistance and productivity.

According to the exemplary embodiment, after the heating process, the temperature of the heated plated steel sheet may be maintained within the heating temperature range of the heating process for a predetermined time period so as to obtain intended material qualities. In this case, if the predetermined time period is too long, a time period during which lower manganese (Mn) or iron (Fe) diffuses to a surface layer and forms oxides by combining with oxygen is also increased. As a result, a thick oxide layer may be formed, and spot weldability may be lowered. Therefore, preferably, the predetermined time period may be set to be within the range of 240 seconds or shorter, for example, about 10 seconds to about 200 seconds, so as to adjust the thickness of an oxide layer to be 1 μm or less.

The hot forming process may be performed by any method usually used in the related art. For example, in a state in which the temperature of the heated plated steel sheet is maintained within the heating temperature range, the heated plated steel sheet may be hot formed into an intended shape by using a press machine. However, the hot forming process is not limited thereto.

In the cooling process, the hot-formed plated steel sheet may preferably be cooled to 100° C. at a cooling rate of 10° C./s or higher. If the cooling rate is lower than 10° C./s, austenite-to-ferrite transformation may increase, and thus the strength of the hot-formed plated steel sheet may decrease after the cooling process.

[Mode for Invention]

Hereinafter, the present disclosure will be described more specifically according to examples.

First, general cold-rolled steel sheets for hot press forming (HPF) having a thickness of 1.5 mm were prepared as base steel sheets. The base steel sheets included carbon (C): 0.22 wt %, silicon (Si): 0.24 wt %, manganese (Mn): 1.56 wt %, phosphorus (P): 0.012 wt %, boron (B): 0.0028 wt %, chromium (Cr): 0.01 wt %, titanium (Ti): 0.03 wt %, and a balance of iron (Fe) and inevitable impurities.

Next, plated steel sheets were manufactured by plating the base steel sheets with manganese (Mn) by a deposition plating method according to plating thicknesses illustrated in Table 1 below. At that time, an alloying element such as zinc (Zn) or magnesium (Mg) was deposited together with manganese (Mn) on some of the base steel sheets. Next, the plated steel sheets were further plated with aluminum (Al) by a deposition plating method. At that time, an alloying element such as silicon (Si) or magnesium (Mg) was deposited together with aluminum (Al) on some of the plated steel sheets. In addition, comparative plated steel sheets were manufactured by plating the base steel sheets with aluminum (Al), manganese (Mn), or zinc (Zn). The amount of plating of the plated steel sheets manufactured as described above was analyzed by dissolving plating layers and converting the dissolved amounts into thicknesses, and the total thickness of the plating layers of each of the plated steel sheets was calculated as illustrated in Table 1 below.

TABLE 1

| No. | Plating layers | First plating layer Plating type | First plating layer Plating thickness (one side, μm) | Second plating layer Plating type | Second plating layer Plating thickness (one side, μm) | Total plating layer thickness (one side, μm) | Plating layer thickness ratio (%) |
|---|---|---|---|---|---|---|---|
| IS1 | Two layers | Mn 100% | 1.5 | Al 100% | 5.1 | 6.6 | 22.7 |
| IS2 | Two layers | Mn 100% | 3.3 | Al 100% | 8.9 | 12.2 | 27 |
| IS3 | Two layers | Mn 100% | 6.4 | Al 100% | 13.9 | 20.3 | 31.5 |
| IS4 | Two layers | Mn 100% | 6.2 | Al 100% | 15.1 | 21.3 | 29.1 |
| IS5 | Two layers | Mn 100% | 6.8 | Al 100% | 8.1 | 14.9 | 45.6 |
| IS6 | Two layers | Mn 100% | 9.5 | Al 100% | 10.1 | 19.6 | 48.5 |
| IS7 | Two layers | Mn 95% Zn 5% | 2.2 | Al 100% | 6.9 | 9.1 | 24.2 |
| IS8 | Two layers | Mn 81% Zn 19% | 4.8 | Al 100% | 12.4 | 17.2 | 27.9 |
| IS9 | Two layers | Mn 100% | 5.1 | Al 92%, Si 8% | 12.3 | 17.4 | 29.3 |
| IS10 | Two layers | Mn 100% | 5.2 | Al 88%, Si 8%, Mg 4% | 12.5 | 17.7 | 29.4 |
| CS1 | Single layer | Al 100% | 15 | — | — | 15 | 100 |
| CS2 | Single layer | Mn 100% | 13.8 | — | — | 13.8 | 100 |

TABLE 1-continued

| | | First plating layer | | Second plating layer | | Total plating layer thickness (one side, μm) | Plating layer thickness ratio (%) |
|---|---|---|---|---|---|---|---|
| No. | Plating layers | Plating type | Plating thickness (one side, μm) | Plating type | Plating thickness (one side, μm) | | |
| CS3 | Single layer | Zn 99.4% Al 0.6% | 9.5 | — | — | 9.5 | 100 |
| CS4 | Two layers | Mn 100% | 13.6 | Al 100% | 1.4 | 15 | 90.7 |
| CS5 | Two layers | Mn 100% | 13.5 | Mn 100% | 2.4 | 15.9 | 84.9 |
| CS6 | Two layers | Mn 100% | 1.2 | Al 100% | 10.1 | 11.3 | 10.6 |
| CS7 | Two layers | Mn 100% | 5.2 | Al 100% | 7.1 | 12.3 | 42.3 |
| CS8 | Two layers | Mn 100% | 0.6 | Al 100% | 15.5 | 16.1 | 3.73 |

IS: Inventive Steel,
CS: Comparative Steel

In Table 1, the plating layer thickness ratio was calculated by the expression: (first plating layer thickness/total plating layer thickness)×100.

Next, an HPF process was performed on each of the plated steel sheets under the conditions illustrated in Table 2 below so as to manufacture formed products, and properties of the formed products were evaluated as illustrated in Table 2 below. At that time, the corrosion resistance of the formed products was evaluated by performing a salt solution test (SST) on the formed products for 1200 hours and measuring the maximum depth of corrosion in iron (Fe) of the base steel sheets of the formed products.

TABLE 2

| | No. | Heating conditions | | | Cooling rate (° C./sec) | Alloy (excluding oxides) | Surface oxide thickness (μm) | Corrosion resistance (SST, corrosion depth, mm) |
|---|---|---|---|---|---|---|---|---|
| | | HT (° C.) | AHR (° C./sec) | MTP (sec) | | | | |
| IE | 1 | 900 | 10 | 150 | 30 | Fe—Al, Fe—Mn—Al | 0.2 | 0.18 |
| | 2 | 880 | 6 | 100 | 30 | Fe—Al, Al—Mn, Fe—Mn—Al | 0.21 | 0.11 |
| | 3 | 880 | 120 | 150 | 25 | Fe—Al, Fe—Mn, Al—Mn, Fe—Mn—Al | 0.23 | <0.1 |
| | 4 | 930 | 30 | 30 | 60 | Fe—Al, Fe—Mn, Al—Mn, Fe—Mn—Al | 0.17 | <0.1 |
| | 5 | 900 | 10 | 200 | 50 | Fe—Al, Fe—Mn, Al—Mn, Fe—Mn—Al | 0.45 | <0.1 |
| | 6 | 900 | 10 | 100 | 30 | Fe—Al, Fe—Mn, Al—Mn, Fe—Mn—Al | 0.37 | <0.1 |
| | 7 | 900 | 10 | 150 | 30 | Fe—Al, Al—Mn, Fe—Mn—Al, Fe—Mn—Al—Mg | 0.68 | 0.14 |
| | 8 | 900 | 10 | 150 | 20 | Fe—Al, Al—Mn, Fe—Mn—Al, Zn—Mn | 0.25 | <0.1 |
| | 9 | 900 | 10 | 150 | 20 | Fe—Al, Al—Mn, Fe—Mn—Al, Fe—Mn—Al—Si | 0.20 | <0.1 |
| | 10 | 900 | 10 | 150 | 20 | Fe—Al, Al—Mn, Fe—Mn—Al, Fe—Mn—Al—Si | 0.73 | <0.1 |
| CE | 1 | 930 | 10 | 150 | 30 | Fe—Al | 0.14 | 0.51 |
| | 2 | 900 | 10 | 150 | 30 | Fe—Mn | >2 | 0.22 |
| | 3 | 930 | 10 | 150 | 30 | Fe—Zn | >2 | 0.33 |
| | 4 | 900 | 10 | 150 | 30 | Fe—Mn, Al—Mn | >2 | 0.20 |
| | 5 | 900 | 10 | 150 | 30 | Fe—Al, Al—Mn, Fe—Mn—Al | >2 | 0.45 |
| | 6 | 900 | 1 | 200 | 30 | Fe—Al, Fe—Mn, Al—Mn, Fe—Mn—Al | 1.1 | 0.22 |
| | 7 | 900 | 6 | 400 | 30 | Fe—Al, Fe—Mn, Al—Mn, Fe—Mn—Al | 1.4 | <0.1 |
| | 8 | 900 | 6 | 150 | 30 | Fe—Al, Fe—Mn—Al | 0.21 | 0.46 |

IE: Inventive Example,
CE: Comparative Example,
HT: Heating Temperature,
AHR: Average heating rate,
MTP: Maintaining Time Period As shown in Tables 1 and 2, each of the hot-press formed members (formed products) of Inventive Examples 1 to 6 included at least two of an Fe—Mn-based alloy, an Fe—Al—Mn-based alloy, an Fe—Al-based alloy, and an Al—Mn-based alloy on an iron surface of the base steel sheet thereof, and the uppermost layer of each of the hot-press formed members of Inventive Examples 1 to 6 included an Al-based alloy. Thus, the thickness of a surface oxide layer of each of the hot-press formed members of Inventive Examples 1 to 6 was less than 1 μm. After the SST, the depth of corrosion in iron (Fe) of the base steel sheet of each of the hot-press formed members of Inventive Examples 1 to 6 was 0.18 mm or less. That is, the hot-press formed members of Inventive Examples 1 to 6 had a high degree of corrosion resistance.

In addition, each of the hot-press formed members of Inventive Examples 7 and 8 included at least two of an Fe—Mn-based alloy, an Fe—Al—Mn-based alloy, an Fe—Al-based alloy, an Al—Mn-based alloy, an Fe—Mn—Al—Mg-based alloy, and a Zn—Mn-based alloy on an iron surface of the base steel sheet thereof, and the uppermost layer of each of the hot-press formed members of Inventive Examples 7 and 8 included an Al-based alloy. Thus, the thickness of a surface oxide layer of each of the hot-press formed members of Inventive Examples 7 and 8 was less than 1 μm. After the SST, the depth of corrosion in iron (Fe) of the base steel sheet of each of the hot-press formed members of Inventive Examples 7 and 8 was 0.14 mm or less. That is, the hot-press formed members of Inventive Examples 7 and 8 had a high degree of corrosion resistance.

In addition, each of the hot-press formed members of Inventive Examples 9 and 10 included at least two of an Fe—Al-based alloy, an Al—Mn-based alloy, an Fe—Al—Mn-based alloy, and an Fe—Mn—Al—Si-based alloy on an iron surface of the base steel sheet thereof, and the uppermost layer of each of the hot-press formed members of Inventive Examples 9 and 10 included an Al-based alloy. Thus, the thickness of a surface oxide layer of each of the hot-press formed members of Inventive Examples 9 and 10 was less than 1 μm. After the SST, the depth of corrosion in iron (Fe) of the base steel sheet of each of the hot-press formed members of Inventive Examples 9 and 10 was 0.1 mm or less. That is, the hot-press formed members of Inventive Examples 9 and 10 had a high degree of corrosion resistance.

However, in the case of the hot-press formed member of Comparative Example 1 having only a single Al plating layer of 15 μm in thickness, an Fe—Al-based alloy having heat resistance was formed on an iron surface of the hot-press formed member, and thus the thickness of a surface oxide layer was 1 μm or less. However, since the Al plating layer did not provide sacrificial corrosion protection to iron (Fe) of the base steel sheet of the hot-press formed member, the depth of corrosion in iron (Fe) of the base steel sheet was 0.51 mm after the SST. That is, the corrosion resistance of the hot-press formed member of Comparative Example 1 was poor.

In the case of the hot-press formed member of Comparative Example 2 having only a single Mn plating layer of 13.8 μm in thickness, an Fe—Mn-based alloy was formed on an iron surface of the hot-press formed member, and a thick surface oxide layer having a thickness of greater than 2 μm was formed because of oxidation of surface manganese (Mn). However, since the Fe—Mn-based alloy provided sacrificial corrosion protection to iron (Fe) of the base steel sheet of the hot-press formed member, the depth of corrosion in iron (Fe) of the base steel sheet was 0.22 mm after the SST. That is, the corrosion resistance of the hot-press formed member was somewhat good.

In the case of Comparative Example 3 using a hot-dip galvanized steel sheet, zinc (Zn) was oxidized at a high temperature, and thus a thick oxide layer having a thickness of greater than 2 μm was formed. In addition, the depth of corrosion in iron (Fe) of the steel sheet was relatively great at 0.33 mm.

In the case of Comparative Example 4, a Mn plating layer was formed as a lower plating layer, and an Al plating layer was formed as an upper plating layer according to the present disclosure. However, the thickness of the lower Mn plating layer was greater than the range proposed in the present disclosure, that is, greater than 60% of the total thickness of the plating layers, and thus some manganese (Mn) of the lower Mn plating layer diffused to a surface layer and formed oxides during a heat treatment process. As a result, the thickness of a surface oxide layer was greater than the range proposed in the present disclosure, that is, greater than 2 μm. However, since an alloy layer provided sacrificial corrosion protection to iron (Fe) of the base steel sheet, the depth of corrosion in iron (Fe) of the base steel sheet was relatively small at 0.2 mm.

In the case of Comparative Example 5 in which an Al plating layer was formed as a lower plating layer and a Mn plating layer was formed as an upper plating layer, manganese (Mn) of the upper Mn plating layer formed surface oxides during a heat treatment process, and thus the thickness of a surface oxide layer was greater than 2 μm, that is, greater than the range proposed in the present disclosure. In addition, since most manganese (Mn) of the upper Mn plating layer was oxidized, the content of manganese (Mn) in an alloy layer was low, and thus poor sacrificial corrosion protection was provided to iron (Fe) of the base steel sheet. Thus, the depth of corrosion in iron (Fe) of the base steel sheet was 0.45 mm. That is, corrosion resistance was poor.

In the case of Comparative Examples 6 and 7, a Mn plating layer was formed, and an Al plating layer was formed on the Mn plating layer in such a manner that the thickness of the Mn plating layer was 60% or less of the total thickness of the plating layers and the total thickness of the plating layers was 5 μm to 30 μm as proposed in the present disclosure. However, an average heating rate and a maintaining time period were outside the ranges proposed in the present disclosure. That is, due to a long heating time period, an oxide layer thicker than those of the inventive examples was formed. However, an alloy layer included at least two of an Fe—Mn-based alloy, an Fe—Al—Mn-based alloy, an Fe—Al-based alloy, and an Al—Mn-based alloy as proposed in the present disclosure, and thus sacrificial corrosion protection was provided to iron (Fe) of the base steel sheet. As a result, the depth of corrosion in iron (Fe) of the base steel sheet was satisfactorily 0.22 mm or less.

In the case of Comparative Example 8, a Mn plating layer was formed as a lower plating layer and an Al plating layer was formed as an upper plating layer according to the present disclosure. However, the thickness of the lower Mn plating layer was smaller than the range proposed in the present disclosure, that is, smaller than 5% of the total thickness of the plating layers. Thus, due to the small thickness of the Mn plating layer, after a heating process, an Fe—Al-based alloy was mainly formed in an alloy layer, and an Fe—Mn—Al-based alloy was formed in a thin region of the alloy layer. As a result, poor corrosion resistance was observed in a corrosion test due to poor sacrificial corrosion protection.

While exemplary embodiments have been shown and described above, it will be apparent to those skilled in the art that modifications and variations could be made without departing from the scope of the present invention as defined by the appended claims.

The invention claimed is:

1. A hot-press formed member comprising:
a base steel sheet;
an alloy layer formed on at least one side of the base steel sheet, wherein the alloy layer comprises at least two alloys selected from the group consisting of an Fe—Mn-based alloy, an Fe—Al—Mn-based alloy, an Fe—Al-based alloy, and an Al—Mn-based alloy; and
a composite plating layer formed on at least one side of the base steel sheet, wherein:
the composite plating layer comprises a Mn-based plating layer and an Al-based plating layer alternately formed with the Al-based plating layer being an uppermost layer,
the composite plating layer has a total thickness of 5 μm to 30 μm,
the Mn-based plating layer has a thickness of 5% to 60% of the total thickness of the composite plating layer, and
the Mn-based plating layer comprises at least one selected from the group consisting of chromium (Cr), zinc (Zn), beryllium (Be), magnesium (Mg), calcium (Ca), and titanium (Ti) in an amount of 5 wt % to 20 wt %.

2. The hot-press formed member of claim 1, wherein the alloy layer comprises an uppermost layer formed of the Fe—Al—Mn-based alloy, the Fe—Al-based alloy, or the Al—Mn-based alloy.

3. The hot-press formed member of claim 1, wherein the alloy layer further comprises at least one alloy selected from the group consisting of a Zn—Mn-based alloy, a Zn—Fe-based alloy, an Fe—Mn—Al—Mg-based alloy, and an Fe—Mn—Al—Si-based alloy.

4. The hot-press formed member of claim 3, wherein the alloy layer comprises an uppermost layer formed of the Fe—Al—Mn-based alloy, the Fe—Al-based alloy, the Al—Mn-based alloy, or the Fe—Mn—Al—Si-based alloy.

5. The hot-press formed member of claim 1, wherein the alloy layer comprises an uppermost layer formed of an Al-containing alloy.

6. The hot-press formed member of claim 1, wherein surface oxides formed on an outermost surface of the alloy layer have a thickness of 2 μm or less.

7. The hot-press formed member of claim 1, wherein the base steel sheet comprises a carbon steel sheet including 0.1 wt % to 0.4 wt % of carbon (C), 0.05 wt % to 1.5 wt % of silicon (Si), 0.5 wt % to 3.0 wt % of manganese (Mn), and a balance of iron (Fe) and inevitable impurities.

8. The hot-press formed member of claim 1, wherein the base steel sheet further comprises at least one selected from the group consisting of 0.001 wt % 0.02 wt % of nitrogen (N), 0.0001 wt % to 0.01 wt % of boron (B), 0.001 wt % to 0.1 wt % of titanium (Ti), 0.001 wt % to 0.1 wt % of niobium (Nb), 0.001 wt % to 0.01 wt % of vanadium (V), 0.001 wt % to 1.0 wt % of chromium (Cr), 0.001 wt % to 1.0 wt % of molybdenum (Mo), 0.001 wt % to 0.1 wt % of antimony (Sb), and 0.001 wt % to 0.3 wt % of tungsten (W).

9. The hot-press formed member of claim 1, wherein the Mn-based plating layer comprises manganese (Mn) in an amount of 80 wt % or greater.

10. The hot-press formed member of claim 1, wherein the Al-based plating layer comprises aluminum (Al) in an amount of 80 wt % or greater.

11. The hot-press formed member of claim 1, wherein the Al-based plating layer comprises at least one selected from the group consisting of zinc (Zn), silicon (Si), magnesium (Mg), and manganese (Mn) in an amount of 20 wt % or less (excluding 0 wt %).

12. The hot-press formed member of claim 1, wherein the Mn-based plating layer comprises zinc (Zn).

13. The hot-press formed member of claim 1, wherein the Mn-based plating layer comprises manganese (Mg).

14. The hot-press formed member of claim 1, wherein the Al-based plating layer comprises silicon (Si).

15. The hot-press formed member of claim 1, wherein the Al-based plating layer comprises manganese (Mn).

* * * * *